US006766486B2

United States Patent
Neeb

(10) Patent No.: US 6,766,486 B2
(45) Date of Patent: Jul. 20, 2004

(54) JOINT TEST ACTION GROUP (JTAG) TESTER, SUCH AS TO TEST INTEGRATED CIRCUITS IN PARALLEL

(75) Inventor: James E. Neeb, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 507 days.

(21) Appl. No.: 09/730,646

(22) Filed: Dec. 5, 2000

(65) Prior Publication Data

US 2002/0069386 A1 Jun. 6, 2002

(51) Int. Cl.[7] ............................................. G01R 31/28
(52) U.S. Cl. ..................................... 714/724; 714/733
(58) Field of Search ................................ 714/727, 736, 714/733, 724, 726, 738, 737, 742; 716/1, 4; 717/128; 324/763

(56) References Cited

U.S. PATENT DOCUMENTS

| | | | | |
|---|---|---|---|---|
| 5,254,942 A | * | 10/1993 | D'Souza et al. ............ | 714/727 |
| 5,325,368 A | * | 6/1994 | James et al. ................ | 714/727 |
| 5,355,369 A | * | 10/1994 | Greenberger et al. ....... | 714/727 |
| 5,377,198 A | * | 12/1994 | Simpson et al. ............ | 714/727 |
| 5,608,736 A | * | 3/1997 | Bradford et al. ............ | 714/727 |
| 5,794,175 A | * | 8/1998 | Conner ....................... | 702/119 |
| 6,163,867 A | * | 12/2000 | Miller et al. ................ | 714/736 |
| 6,425,101 B1 | * | 7/2002 | Garreau ...................... | 714/727 |
| 6,481,000 B1 | * | 11/2002 | Zaveri et al. ................ | 716/17 |

* cited by examiner

Primary Examiner—Albert Decady
Assistant Examiner—Mujtaba Chaudry
(74) Attorney, Agent, or Firm—Blakley, Sokoloff, Taylor & Zafman LLP

(57) ABSTRACT

A JTAG tester includes a JTAG controller in a PCI slot of a PC, a port multiplexer, a programmable power supply, and drive and compare logic, which tracks $V_{cc}$. The tester reads and blows information and configuration fuses on the silicon using the JTAG port. The tester pipes the JTAG port into a 1-to-N multiplexer, where N is the number of sockets being tested in parallel. The multiplexer is different from conventional multiplexers in that it allows selection of any combination of sockets, not just any one of the N sockets. Thus the same data can be driven into any combination of devices for parallel programming of fuse registers. Data being read out is read one device for separate evaluation via the single port back to the controller PC.

16 Claims, 3 Drawing Sheets

JOINT TEST ACTION GROUP (JTAG) TESTER, SUCH AS TO TEST INTEGRATED CIRCUITS IN PARALLEL

BACKGROUND OF THE INVENTION

1. Field of the Invention

The invention is related to integrated circuits, and in particular, to a JTAG tester for use with integrated circuits.

2. Background Information

A group of key electronic companies proposed a technique whereby integrated circuits (i.e., chips) on a printed circuit board could be tested easily by incorporating software-controlled hardware into the integrated circuit during manufacturing. This technique was approved by the well-known Institute of Electrical and Electronics Engineers (IEEE) as IEEE Standard 1149.1. Because the group of key electronic companies was known as the Joint Test Action Group, the terms "IEEE Standard 1149.1" and "JTAG Standard" often are used interchangeably.

The IEEE 1149.1 or JTAG Standard specifies the hardware and software needed to enable testing of chips. According to the JTAG Standard, a single cell of a shift-register is designed into the integrated circuit logic and linked to every digital pin of the integrated circuit. This single cell links the JTAG circuitry to the integrated circuit's internal core logic. A group of cells on a particular integrated circuit is referred to as a register. The register logic becomes active when performing JTAG testing and remains passive under normal integrated circuit operation.

Also according to the JTAG Standard, the integrated circuit architecture for each JTAG compatible device has a test access port (TAP port), which has four (or optionally five) pins, any one of which may be referred to as a "boundary pin" or a "test access pin." For example, a test clock (TCK) pin receives a test clock signal for the device under test. A test mode select (TMS) pin accepts commands to select particular test modes. A test data in (TDI) pin accepts data into the device under test. A test data output (TDO) pin sends data out from the device under test.

There are several testers currently available. Many are expensive multiport JTAG testers or high pin count functional testers. A 9000 series tester from Schlumberger is an example. There are other less expensive single port JTAG testers. These testers connect the JTAG ports in series in a chain and test the JTAG ports in parallel. This scheme is slow and susceptible to failure if any of the devices in the chain malfunction.

This is because JTAG was originally designed to devices mounted on a printed circuit board by serially connecting TAP ports to each other. When testing, data is scanned in through one TAP port to the next TAP port until all TAP ports are all filled. A command is run and data is shifted out in the same manner. This scheme is adequate for testing an assembly of printed circuit boards because if a particular printed circuit board is bad, it does not matter where on the printed circuit board the fault is located. The entire printed circuit fails and can be rejected.

When testing integrated circuits using JTAG, multiple integrated circuits are placed in a test tray. The test tray has sockets for a certain number of devices. If one or more of the sockets in the test tray fails to function, because the device in the socket is faulty, for example, then none of the integrated circuits in any of the sockets in the tray can be tested properly. To properly test all of the integrated circuits, the test must be performed multiple times, which multiplies the retest rate significantly. This is problematic because as the number of tests needed is increased, the time it takes to test a tray of devices is increased and the efficiency of the test process is reduced.

Moreover, the traditional scheme does not allow testing of trays whose sockets are not fully populated with devices. This means that no partial trays can be tested using the conventional testing scheme.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

A system and corresponding methods to test multiple integrated circuits in parallel via a JTAG port are described in detail herein. In the following description, numerous specific details are provided, such as particular processes, operating systems, counters, registers, etc. to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Some parts of the description will be presented using terms such as program, controller, multiplexer, driver, processor, and so forth. These terms are commonly employed by those skilled in the art to convey the substance of their work to others skilled in the art.

Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Reference throughout this specification to "one embodiment" or "an embodiment" means that a particular feature, structure, process, step, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in turn in a manner that is most helpful in understanding the invention. However, the order in which they are described should not be construed to imply that these operations are necessarily order dependent or that the operations be performed in the order in which the steps are presented.

Figure 1:
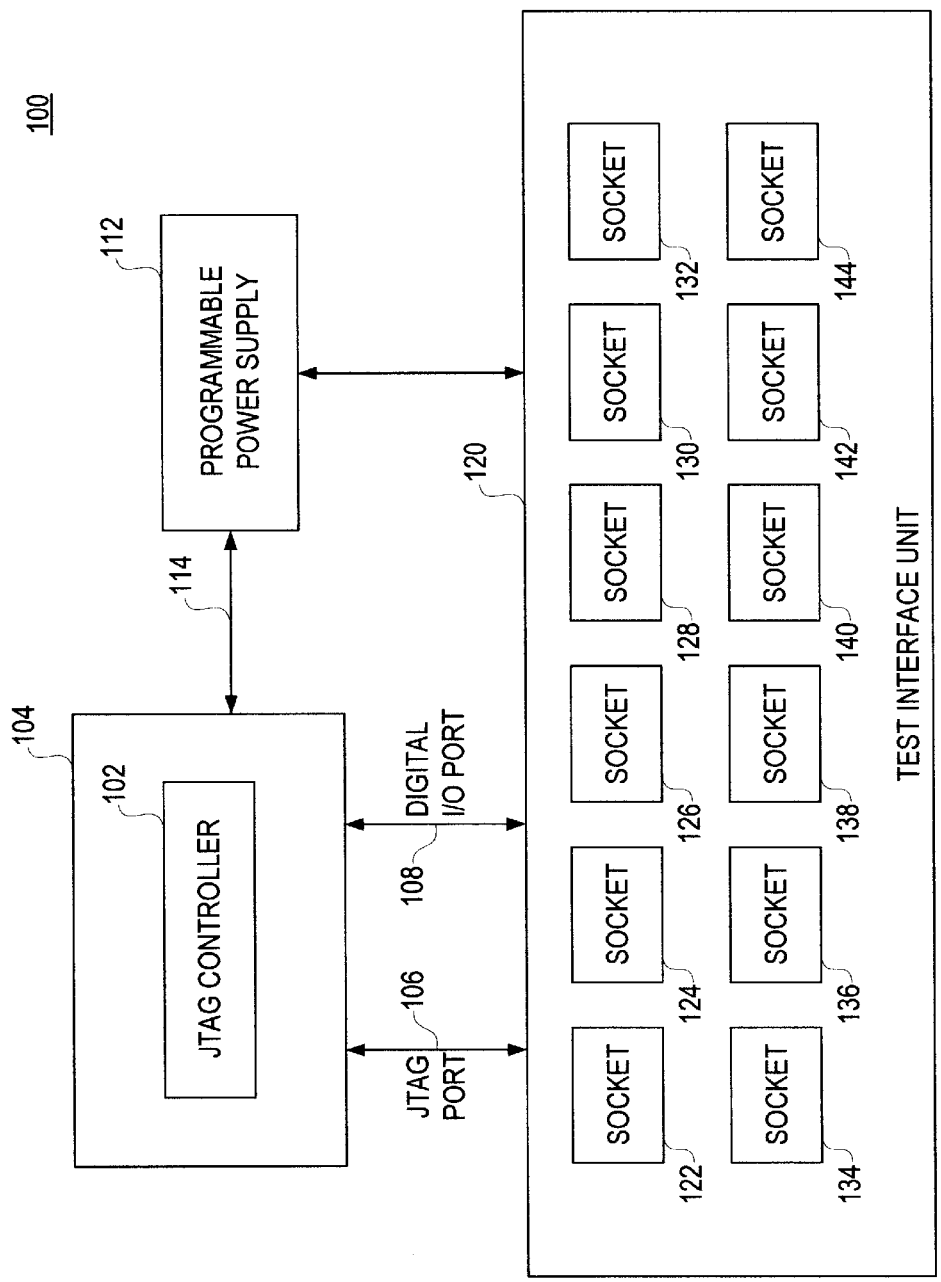
FIG. 1 is a high-level block diagram of a JTAG tester according to an embodiment of the present invention.

FIG. 1 is a high-level block diagram of a JTAG tester 100 suitable for implementing aspects of the present invention. The tester 100 is simple and inexpensive, yet robust, and can accommodate (e.g., read, program, test, etc.) many devices in parallel. The tester 100 also can accommodate all devices in a tray regardless of whether one or more of the devices are malfunctioning. One reason is because the tester does not rely on the industry standard methodology of chaining the JTAG ports together.

The tester 100 includes a JTAG controller 102. In one embodiment, the JTAG controller 102 is an off-the-shelf IEEE Standard 1149.1 debug board. A JTAG controller suitable for implementing aspects of the present invention is the PCI-1149.1 JTAG/Boundary Scan Controller available from Corelis Inc., in Cerritos, Calif. In this embodiment, the JTAG controller 102 fits into a peripheral component interconnect (PCI) slot of a personal computer 104, which, in one embodiment, is any well-known off-the-shelf Windows® NT-based personal computer. A suitable personal computer is an IBM PC available from International Business Machines (IBM) in Armonk, N.Y. Also in this embodiment, the JTAG controller 102 receives power from the PCI slot in the personal computer 104.

In another embodiment, the JTAG controller 102 is a customized stand-alone board. In this embodiment the JTAG controller 102 also is compatible with the IEEE Standard 1149.1.

The JTAG controller 102 has a JTAG port 106. Although not so depicted in FIG. 1, the JTAG port 106 represents at least four boundary pins or test access pins. For example, the JTAG port 106 includes a test clock (TCK) pin to receive a test clock signal for the device under test, a test mode select (TMS) pin to accept commands to select particular test modes, a test data in (TDI) pin to accept data into the device under test, a test data output (TDO) pin to send data out from the device under test, and a test reset (TRST) pin to initialize the device under test to a known state.

In many integrated circuits, fuses are used to store information, form connections, program elements for redundancy, store identification, configuration, or other information, etc. The tester 100 can access fuses on devices under test via the JTAG port 106. The tester 100 "reads" fuses to determine whether they have been programmed. The tester 100 distinguishes between programmed and un-programmed fuses by reading a fuse register which contains a binary representation of the status of the actual fuses.

The tester 100 also "blows" or "programs" fuses as well. For example, the fuses on an integrated circuit can be blown or programmed in a pattern to indicate that the integrated circuit's operating frequency is 700 megahertz (MHz). Once the fuses are blown in this pattern, the integrated circuit may not function at frequencies other than 700 MHz.

Although the tester 100 reads and blows information and configuration fused on the silicon of an integrated circuit, the present invention is not so limited. For example, the tester 100 may perform any sort of testing on an integrated circuit or chip that can be accessed by the JTAG port 106.

The JTAG controller 102 also has a digital input/output (I/O) port 108, which supports several digital I/O lines. The digital I/O port 108 connects to a multiplexer located on a test interface unit 120, which is described in more detail below. The digital I/O port 108 also can control a programmable power supply, if needed. The digital I/O lines of the digital I/O port 108 are software programmable.

The tester 100 includes a programmable power supply 112, which supplies power to the operate devices under test. The programmable power supply 112 also supplies pull-up voltage for JTAG inputs to the devices under test.

In one embodiment, the programmable power supply 112 is a Voltage Regulation Module (VRM) commonly used in personal computer (PC) motherboards to power the central processing unit (CPU). This type of power supply is typically controlled via digital I/O signals.

In another embodiment, the programmable power supply 112 is a standard instrumentation type power supply, such as is used in rack mount equipment. These types of power supplies are typically controlled via RS232 or GPIB (IEEE standard buses), which can be provided by the controller personal computer 104.

The personal computer 104 is coupled to the programmable power supply 112 via a communication link 114. In one embodiment, the communication port 114 is a well-known RS-232 serial port. Other suitable communication ports include the well-known general purpose interface bus (GPIB/IEEE 488) port, Hewlett-Packard interface bus (HPIB), or some other similar communication port.

The JTAG port 104 and the programmable power supply 112 are coupled to the test interface unit 120. The test interface unit 120 multiplexes JTAG signals to the devices under test via sockets. The test interface unit 120 also level shifts JTAG signals to the devices under test.

The test interface unit 120 in one embodiment is a printed circuit board with several sockets mounted thereon. For example, the test interface unit 120 has sockets 122, 124, 126, 128, 130, 132, 134, 136, 138, 140, 142, and 144 mounted on it. Each socket can accommodate one device for test, reading, programming, etc. Devices can be microprocessors, microcontrollers, programmable logic displays (PLDs), CPLDs, field programmable gate arrays (FPGAs), application specific integrated circuits ASICs), or any other discrete device that conforms to the well-known IEEE 1149.1 specification.

Although only twelve sockets are shown for purposes of illustration, the number of sockets does not limit the present invention. For example, the tester 100 is expandable to easily test as many devices at once as are desired.

Figure 2:
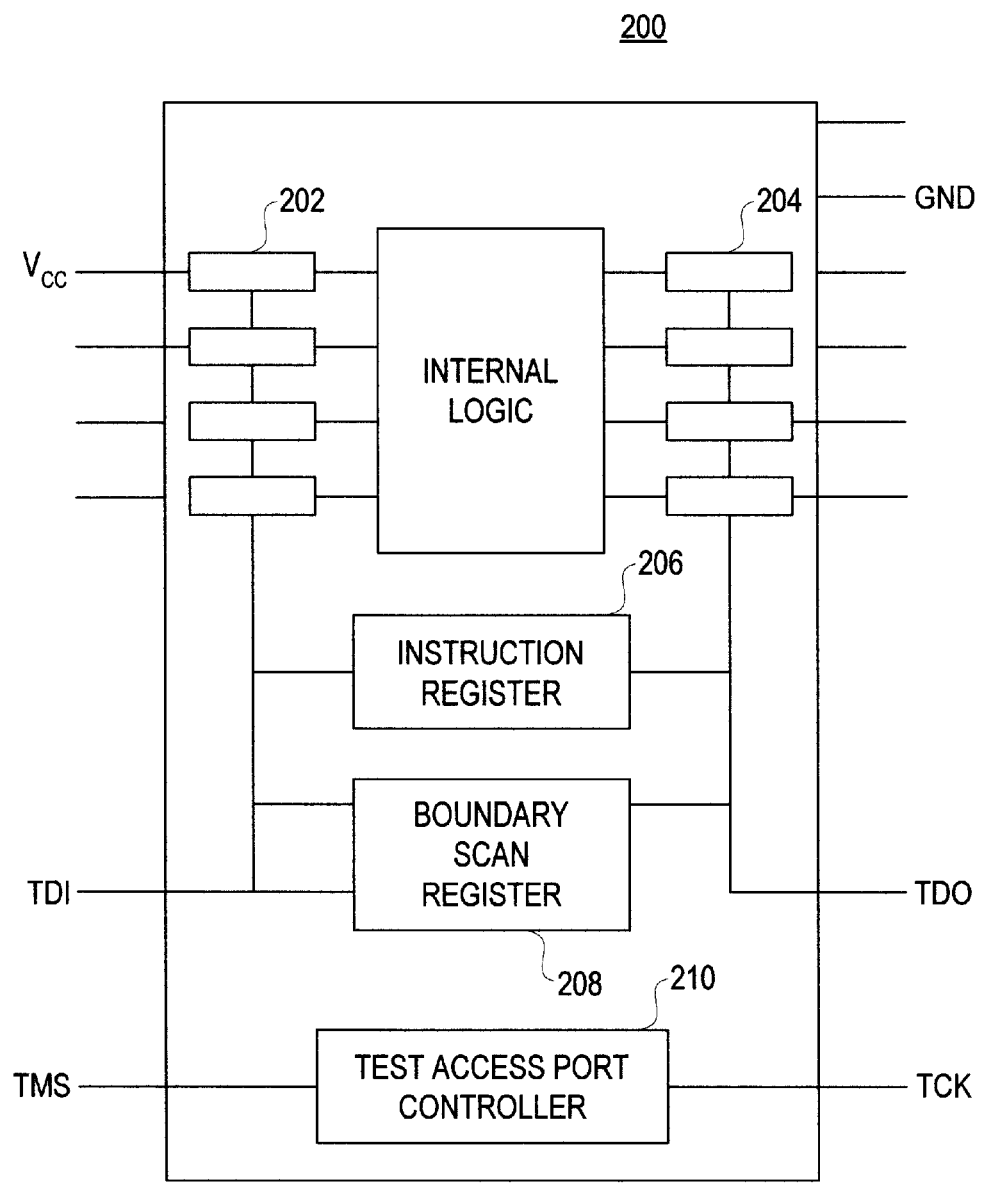
FIG. 2 shows an example of a JTAG-compatible integrated circuit.

FIG. 2 shows an example JTAG-compliant device 200, which has pins for power (VCC), ground (GND), TDI, TDO, TMS, and TCK. The integrated circuit 200 also has several fuse registers, such as illustrated fuse registers 202 and 204, an instruction register 206, a fuse register 208, and a test access port controller 210. When programming (or writing to) the device 200, some or all fuses are blown and the status of all fuses is stored in the fuse registers. The tester 100 blows each fuse one bit at a time. Because blowing the fuses is done one bit at a time, the tester 100 programs all devices in parallel, which saves time.

Data in (e.g., TDI) can be driven into the fuse register for each device.

When reading the device 200, the fuse registers are read. Reading is done in series. Data out (e.g., TDO) of the devices is read one device at a time and is evaluated separately. This is because there is only one JTAG port 106 back to the PC 104.

The tester 100 verifies fuses by scanning out the whole fuse register at once. As a result, the penalty of having to read data one device at a time is negligible.

Figure 3:
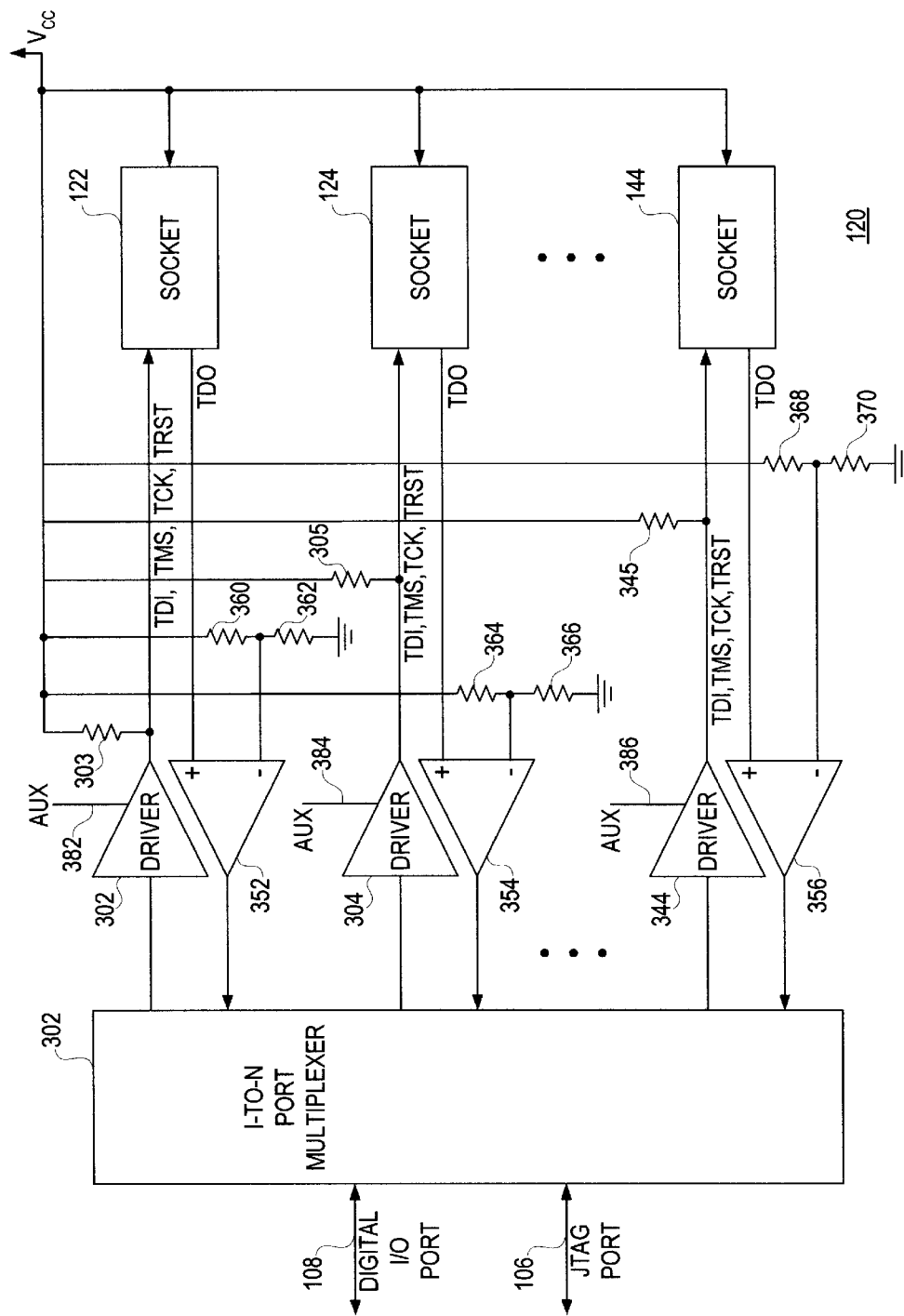
FIG. 3 is a schematic diagram of the JTAG tester test interface unit depicted in FIG. 1.

FIG. 3 is a schematic diagram of a portion of the test interface unit 120. One feature of the present invention is that each JTAG port 106 is coupled to an open collector driver (e.g., drivers 302, 304, . . . 344) to receive the outputs from the JTAG ports and drive the four JTAG inputs, i.e., TDI, TMS, TCK, and TRST, to the socket. The open collector drivers scale automatically to $V_{cc}$. As a result, only one programmable power supply 112 is needed for the tester 100.

Each driver has a pull-up resistor (e.g., 303, 305, . . . 345) tied to $V_{cc}$. In one embodiment, each pull-up resistor is fifty ohms. Suitable open collector drivers are SN74AS757 octal buffers and line drivers with open-collector outputs available from Texas Instruments in Austin Tex.

Another feature of the present invention is that each digital I/O port 108 is coupled to a comparator (e.g., 352, 354, . . . 356) on the TDO output of the socket (e.g., 122, 124, . . . 144, respectively). Each comparator is biased for $V_{cc}/2$ and has hysteresis on the input to avoid false switching caused by noise.

A resistor divider (formed by resistor dividers 360/362, 364/366, . . . 368/370) sets the threshold (or bias) voltage for the comparators (e.g., 352, 354, and 356, respectively) The drive and compare logic tracks $V_{cc}$. An advantage of this feature is that the tester 100 is expandable to future process generation's ever shrinking supply voltages (e.g., $V_{cc}$) and input levels without having to use expensive programmable drive and compare levels. The tester 100 is compatible with all future devices regardless of process technology because the drive and compare levels will track $V_{cc}$ from the programmable power supply 112. Otherwise, the JTAG ports would also have to have programmable drive/compare levels, which would raise the cost of the tester considerably.

Although the programmable power supply 112 supplies power to the devices under test in the sockets (e.g., 122, 124, . . . 144) and their associated pull-up resistors (e.g., 303, 305, . . . 345, respectively), a separate fixed-voltage power source (not shown) supplies power to the test interface unit's 120 drive and compare logic. For example, an auxiliary voltage (e.g., aux 382, 384, . . . 386) supplies voltage to the drivers (e.g., 303, 305, and 345, respectively) and comparators (e.g., 352, 354, . . . 356, respectively). The fixed-voltage power source can be coupled to the test interface unit 120 via a cable or wires.

In one embodiment, linear voltage regulators, such as LM1084 voltage regulators available from National Instruments in Austin, Tex., are mounted on the test interface unit 120. A twelve-volt power supply (not shown) mounted on the personal computer 104 supplies power to the linear voltage regulators. The twelve-volt power supply also supplies power to the programmable power supply 112.

In the embodiment in which the JTAG controller 102 is a customized stand-alone board, the linear regulators supply power to the JTAG controller.

The test interface unit 120 includes a 1-to-N port multiplexer 301, where N is the number of sockets being tested in parallel. Still another feature of the tester 100 is that the multiplexer 302 selects of any combination of sockets, not just any one of the N sockets. An advantage of this feature is that the same data may be driven into any combination of devices. The result is that the tester 100 programs fuses in parallel. A suitable multiplexer is an off-the-shelf field programmable gate array (FPGA) programmed to multiplex any combination of ports.

The JTAG port 106 and the digital I/O port 108 are coupled to the multiplexer 301. The digital I/O port 108 controls the multiplexer 301.

Aspects of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system, comprising:
   a joint test access group (JTAG) controller having JTAG signals;
   a test interface unit coupled to the JTAG controller, the test interface unit having several sockets, the test interface unit having drive and compare logic, the test interface unit coupled to multiplex the JTAG signals to one or any combination of sockets in parallel, the test interface unit coupled to read the JTAG signals from one or any combination of the sockets in series, the drive and compare logic coupled to drive test data into the sockets in parallel, to receive test data out from the sockets in series, and to compare the received test data to a threshold voltage; and
   a programmable power supply coupled to the JTAG controller and to the test interface unit, the programmable power supply to generate a supply voltage to power devices under test,
   wherein the drive and compare logic comprises an open collector driver coupled to automatically scale to the supply voltage.

2. The system of claim 1, further comprising a personal computer (PC) having a peripheral component interconnect (PCI) slot, wherein the JTAG controller is coupled to the PCI slot.

3. The system of claim 1, further comprising a personal computer (PC) comprising having a peripheral component interconnect (PCI) slot, wherein the JTAG controller fits into the PCI slot and wherein the PCI slot is coupled to supply power to the JTAG controller.

4. The system of claim 1, wherein the drive and compare logic comprises a comparator and a resistor divider network, wherein the resistor divider network is coupled to generate a comparator threshold voltage that is one-half the supply voltage.

5. The system of claim 1, wherein the JTAG controller further comprises a digital input/output port coupled to control the test interface unit.

6. An apparatus, comprising:
   a printed circuit board comprising:
      several sockets having a supply voltage;

first logic coupled to receive data from a Joint Test Action Group (JTAG) controller and to drive the data in to device sockets in parallel;

second logic coupled to receive data out from the device sockets in series and to compare the data to a threshold voltage, the second logic comprising a comparator and a resistor divider network, wherein the threshold voltage tracks supply voltage for the sockets; and a multiplexer coupled to select any combination of sockets to be coupled to the first and second logic.

7. The apparatus of claim 6, wherein the sockets are to hold an integrated circuit.

8. The apparatus of claim 6, wherein the first logic comprises an open collector driver coupled to automatically scale to the supply voltage.

9. The apparatus of claim 6, wherein the second logic comprises a comparator and a resistor divider network, wherein the resistor divider network is coupled to generate a comparator threshold voltage that is one-half the supply voltage.

10. An apparatus, comprising:

an integrated circuit having a supply voltage, comprising:
first logic coupled to receive data from a Joint Test Action Group (JTAG) controller and to drive the data in to device sockets;

second logic coupled to receive data out from the device sockets and to compare the data to a threshold voltage, wherein the second logic comprises a comparator and a resistor divider network, wherein the threshold voltage tracks supply voltage for the sockets; and third logic coupled to select any combination of sockets to be coupled to the first and second logic.

11. The apparatus of claim 10, wherein the first logic comprises an open collector driver coupled to automatically scale to the supply voltage.

12. The apparatus of claim 10, wherein the second logic comprises a comparator and a resistor divider network, wherein the resistor divider network is coupled to generate a comparator threshold voltage that is one-half the supply voltage.

13. The system of claim 10, wherein each device socket can couple a device to be programmed.

14. A system, comprising:

an integrated circuit having a supply voltage, comprising:
first logic to receive data from a Joint Test Action Group (JTAG) controller and to drive the data in to device sockets;

second logic to receive data out from the device sockets and to compare the data to a threshold voltage, wherein the threshold voltage tracks supply voltage for the sockets; and third logic coupled to select any combination of sockets to be coupled to the first and second logic; and several device sockets coupled to the integrated circuit.

15. The system of claim 14, wherein the first logic is to write the data to any combination of devices mounted in the device sockets in parallel.

16. The system of claim 14, wherein the second logic is to read data from the device sockets in series.

* * * * *